United States Patent [19]
Hills et al.

[11] Patent Number: 5,382,316
[45] Date of Patent: Jan. 17, 1995

[54] PROCESS FOR SIMULTANEOUS REMOVAL OF PHOTORESIST AND POLYSILICON/POLYCIDE ETCH RESIDUES FROM AN INTEGRATED CIRCUIT STRUCTURE

[75] Inventors: Graham W. Hills, Los Gatos; Ruth E. Bucknall, Mountain View, both of Calif.

[73] Assignee: Applied Materials, Inc., Santa Clara, Calif.

[21] Appl. No.: 145,357

[22] Filed: Oct. 29, 1993

[51] Int. Cl.[6] ............................................. H01L 21/00
[52] U.S. Cl. ...................... 156/643; 156/646; 156/651; 156/657; 156/668; 134/1; 134/2
[58] Field of Search ............... 156/643, 646, 651, 657, 156/668; 134/1, 2, 31

[56] References Cited

U.S. PATENT DOCUMENTS

| | | | |
|---|---|---|---|
| 5,030,590 | 7/1991 | Amini et al. | 437/233 |
| 5,147,499 | 9/1992 | Szwejkowski et al. | 156/643 |
| 5,174,856 | 12/1992 | Hwang et al. | 156/643 |
| 5,200,031 | 4/1993 | Latchford et al. | 156/659.1 |
| 5,221,424 | 6/1993 | Rhoades | 156/643 |
| 5,228,950 | 7/1993 | Webb et al. | 156/643 |
| 5,296,093 | 3/1994 | Szwejkowski et al. | 156/643 |

Primary Examiner—Thi Dang
Attorney, Agent, or Firm—John P. Taylor

[57] ABSTRACT

A plasma etch process is described for simultaneously removing photoresist and etch residues, such as silicon oxide residues, remaining on a substrate from a prior polysilicon and/or polycide etch. The process comprises: (a) generating radicals in a plasma generator upstream of an etch chamber, from an etch gas mixture comprising (i) oxygen, water vapor, or a mixture of same; and (ii) one or more fluorine-containing etchant gases; and (b) then contacting the substrate containing the photoresist and residues from the previous polysilicon/polycide etch with the generated radicals in the etch chamber to remove both the photoresist and the etch residues during the same etch step.

19 Claims, 1 Drawing Sheet

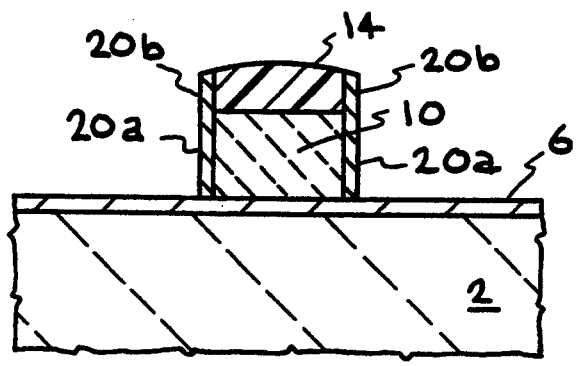

PROVIDING A SUBSTRATE HAVING A RAISED POLYSILICON PORTION WITH SIDEWALL RESIDUES THEREON AND A PHOTORESIST MASK OVER THE POLYSILICON

---

INSERTING THE SUBSTRATE INTO A VACUUM ETCH CHAMBER MAINTAINED AT A PRESSURE OF FROM ABOUT 100 MILLITORR TO ABOUT 10 TORR AND A SUBSTRATE TEMPERATURE OF FROM ABOUT 100°C TO ABOUT 400°C

---

GENERATING FREE RADICALS IN A PLASMA GENERATOR LOCATED UPSTREAM OF THE VACUUM ETCH CHAMBER FROM A MIXTURE OF ETCHANT GASES CONSISTING ESSENTIALLY OF (A) ONE OR MORE FLUORINE-CONTAINING GASES AND (B) OXYGEN, WATER VAPOR, OR A MIXTURE OF BOTH

---

REMOVING BOTH THE PHOTORESIST AND ETCH RESIDUES FROM THE POLYSILICON ON THE SUBSTRATE IN THE SAME STEP IN THE ETCH CHAMBER WITH THE FREE RADICAL PLASMA

FIG. 2

PROCESS FOR SIMULTANEOUS REMOVAL OF PHOTORESIST AND POLYSILICON/POLYCIDE ETCH RESIDUES FROM AN INTEGRATED CIRCUIT STRUCTURE

BACKGROUND OF THE INVENTION

1. Field of the Invention

This invention relates to an etch process useful in the manufacture of integrated circuit structures. More particularly, this invention relates to an etch process for simultaneous removal of photoresist and etch residues remaining from a metal silicide and/or polysilicon etch.

2. Description of the Related Art

In the construction of an integrated circuit structure on a substrate, etching of a masked polysilicon layer, for example, to form polysilicon lines on the structure, or the etching of a dual layer (polycide) structure comprising a metal silicide layer and a polysilicon layer to form dual layer lines on the integrated circuit structure, can result (in either case) in the formation of etch residues, such as, for example, sidewall deposits on the sidewalls of the polysilicon or metal silicide/polysilicon lines.

For example, as shown in FIG. 1, when a line 10 (which may comprise either a polysilicon line or a dual layer polycide line structure) is formed over a gate oxide layer 6 on a silicon semiconductor wafer 2, by patterning a photoresist layer to form a photoresist mask 14 and then anisotropically etching an underlying polysilicon and/or polycide layer through the mask, a residue 20a may form on the sidewalls of line 10, and a similar residue 20b may form on the sidewalls of photoresist mask 14.

Such etch residues may, for example, comprise $SiBr_x$ or $SiCl_y$ etch products or a silicon-rich oxide, $SiO_x$. However, in any event, the residues must be removed from the integrated circuit structure, since they often interfere with the subsequent formation of other materials on the structure, due to their poor adherence and possible contamination of other materials.

Conventionally, such etch residues have been removed by wet etching with dilute HF solutions. However, since HF will also attack gate oxide, monitoring of the wet etch is very important. Amini et al. U.S. Pat. No. 5,030,590, issued Jul. 9, 1991, and assigned to the assignee of this invention, proposed the use of a hydroxide wet etch instead of HF to reduce the damage to oxide portions of the structure.

Subsequently, in Webb et al. U.S. Pat. No. 5,228,950, issued Jul. 20, 1993, and assigned to the assignee of this invention, it was proposed to substitute a dry etch process for the previously used wet etch processes. Webb et al. taught the use of an $NF_3$ plasma etch, to remove oxide-containing deposits, such as the residues shown in FIG. 1, previously formed on the sidewalls of polysilicon lines and the sidewalls of the overlying photoresist during the etching of the polysilicon. The dry residue-removal etch process was conducted in the same chamber used for the polysilicon etch, i.e., before removal of the substrate to another chamber for removal of the photoresist. The Webb et al. patent states that the $NF_3$ etchant gas may be used alone or in combination with one or more additional reactive gases such as $SF_6$, $Cl_2$, and $CF_4$, as well as one or more carrier gases such as helium, oxygen, or argon, using a plasma ignited in the etch chamber.

While such a dry etch process will remove the etch residues remaining from a polysilicon/polycide etch, it does introduce an additional step into the process after the polysilicon/polycide etch step, and prior to the photoresist removal step. It would, therefore, be advantageous if the etch residues from the polysilicon and/or polycide etch could be removed without the need for an additional cleaning step, for example, if such residues could be removed simultaneously with the removal of the photoresist mask over the etched polysilicon and/or polycide, thus eliminating the additional cleaning step.

SUMMARY OF THE INVENTION

The invention comprises a plasma etch process for simultaneously removing photoresist and etch residues, such as $SiBr_x$, $SiCl_y$, and silicon oxide residues, remaining on a substrate from a prior polysilicon/polycide etch which comprises: (a) generating radicals in a plasma generator upstream of an etch chamber, from an etch gas mixture comprising (i) oxygen, water vapor, or a mixture of same; and (ii) one or more fluorine-containing etchant gases; and (b) then contacting a substrate containing photoresist and residues from a previous polysilicon/polycide etch with the generated radicals in the etch chamber to remove both the photoresist and the etch residues during the same etch step.

BRIEF DESCRIPTION OF THE DRAWINGS

FIG. 1 is a fragmentary vertical side section view of a prior art integrated circuit structure showing etch residues remaining on the sidewalls of a polysilicon line formed on a substrate by etching a polysilicon layer through a photoresist mask.

FIG. 2 is a flowsheet illustrating the process of the invention.

DETAILED DESCRIPTION OF THE INVENTION

The invention comprises a process for simultaneous removal of a photoresist mask and etch residues remaining from a prior polysilicon and/or polycide etch, which comprises first generating radicals, in a radical plasma generator upstream of an etch chamber, from an etch mixture preferably consisting essentially of (i) oxygen, water vapor, or a mixture of same; and (ii) one or more fluorine-containing etchant gases; and then contacting a substrate containing photoresist and etch residues from a previous polysilicon/polycide etch with the generated radicals in the etch chamber to remove both the photoresist and the etch residues in the same etch step.

The term "radical", as used herein is intended to define uncharged particles such as atoms or molecular fragments which are generated by the upstream plasma generator and then flow into the plasma etch chamber.

The term "polycide", as used herein, is intended to define a sandwich or dual layer structure comprising a metal silicide layer and a polysilicon layer, with the metal silicide layer usually formed over the polysilicon layer, for example, by depositing a tungsten silicide layer by CVD or PVD means over a polysilicon layer and then annealing the structure. The term "etch residues", as used herein, is therefore intended to define residues remaining from either a polysilicon etch and/or a polycide etch.

When using an etch chamber of, for example, about 2-3 liters in volume, the flow of oxygen and/or water vapor into the radical plasma generator located upstream of the etch chamber may range from as little as about 300 standard cubic centimeters (sccm) to as much as 3000 sccm. Preferably the flow will range from about 500 sccm to about 2000 sccm, with the typical flow being about 1000 sccm. It will, of course, be understood that the flow rate may need to be suitable adjusted for either a smaller or larger etch chamber, or for etch rate and uniformity optimization.

In accordance with the invention, one or more fluorine-containing gases are also flowed into the radical plasma generator. The total amount of such one or more fluorine gases will range from about 0.1 volume percent (vol. %) to about 20 vol. % of the flow of the oxygen and/or water vapor into the plasma generator. Preferably, the total amount of fluorine containing gases flowed into the plasma generator will range from about 0.1 vol. % to less than about 10 vol. %. of the oxygen and/or water vapor flow.

The one or more fluorine-containing gases may comprise, for example, $C_xF_y$, where x is 1-4 and y is either 2x or 2x+2; $C_xH_zF_y$, where x is 1-4, y is either from 1 to 2x+1 or from 1 to 2x-1, and z is 2x+2-y when y ranges from 1 to 2x+1 or 2x-y when y ranges from 1 to 2x-1; $NF_3$; or $SF_6$; as well as mixtures of two or more of same. Preferably, the one or more fluorine-containing gases consist essentially of $C_xF_y$, where x is 1-4 and y is either 2x or 2x+2; $C_xH_zF_y$, where x is 1-4, y either ranges from 1 to 2x+1 or from 1 to 2x-1, and z is 2x+2-y when y ranges from 1 to 2x+1 or 2x-y when y ranges from 1 to 2x-1; and mixtures of same. Most preferably, the fluorine-containing gas consists essentially of $CF_4$.

Optionally, one or more non-reactive carrier gases, such as helium or argon, may be flowed into the plasma generator with the etchant gases for etch rate or uniformity control. However, in view of the volume of the flow of oxygen and/or water vapor into the plasma generator, such a flow of carrier gas will usually be deemed to be unnecessary.

The upstream plasma generator used in the process of the invention may comprise any plasma generator wherein the gases used to form the plasma are flowed into a separator chamber, or separate portion of the main etch chamber, wherein radicals formed in the plasma from the gases then flow into the main etch chamber while electrons and other charged particles, i.e., ionized portions of the etch gases, do not flow into the etch chamber, for example, by losing their charge by contact with the grounded walls, or by being repelled by a screen across the plasma flow path. This is important to the etch process of the invention, because at this stage of the processing, it is usually not desirable to bombard the portions of the integrated circuit structure already formed on the substrate with either electrons or ions. It should be noted in this regard, that the substrate support in the etch chamber is not connected to a power supply, i.e., is normally not biased, when using a plasma consisting essentially of only radicals, but rather is preferably grounded.

Upstream plasma generators which are capable of providing a source of radicals, substantially without ions or electrons, are described, for example, in Hwang et al. U.S. Pat. No. 5,174,856 and Latchford U.S. Pat. No. 5,200,031, the disclosure of each of which is hereby incorporated by reference. Upstream plasma generators which are capable of supplying a source of radicals in the substantial absence of electrons and/or ions are commercially available from Applied Materials, Inc. as an Advanced Strip Passivation (ASP) Chamber.

The power level of the plasma may range from as little as about 500 watts up to as high as 5 KW or higher, depending upon the relative sizes of the plasma generator and the etch chamber. It should be noted that the plasma generator does not have to be any particular type of plasma generator. For example, either a microwave or an RF type plasma generator may be utilized, with or without magnetic enhancement.

The pressure in the etch chamber during the etching is usually maintained within a range of from about 100 milliTorr to about 10 Torr. Preferably the pressure is maintained within a range of from about 500 million to about 4 Torr, with a typical pressure being about 2 Torr.

The temperature of the substrate during the etch is usually maintained within a range of from about 100° C. to about 400° C., preferably from about 150° C. to about 300° C., and most preferably from about 200° C. to about 250° C., as is routinely used during conventional photoresist stripping.

The plasma etch is usually carried out for a period of from about 30 seconds to about 5 minutes, preferably for about 60 seconds to about 3 minutes, and typically about 90 seconds, to remove all of the photoresist, as well as the etch residues on the sidewalls of the polysilicon on the substrate. The etch may, if desired, be carried out to an endpoint using, for example, a laser interferometer, to monitor the polysilicon removed in the etch and to detect the polysilicon/oxide interface.

To further illustrate the process of the invention, a substrate, having previously had a polycide layer etched through a photoresist mask to form raised polycide portions having etch residues present on the sidewalls of the polycide, as well as on the sidewalls of the etch mask overlying the patterned polycide, was subjected to the process of the invention to remove both the etch residues and the photoresist mask in the same etch step. The substrate was loaded into an etch chamber connected to an upstream plasma generator. The substrate support was maintained at a temperature of about 250° C. during the etch and the chamber pressure was maintained at about 2 Torr. A mixture of etchant gases consisting essentially of about 4000 sccm of oxygen and 9 sccm of $CF_4$ were flowed into the upstream plasma generator and a plasma was ignited in the plasma generator. After about 1.5 minutes (90 seconds), the flow of etchant gases into the plasma generator was shut off and the power supply was shut off to extinguish the plasma. The etched substrate was then removed from the etch chamber and the polycide raised portions were examined by SEM. The photoresist over the polycide had been removed, and no residues remained on the sidewalls of the polycide. Similar results may be obtained when water vapor is substituted for the oxygen gas and/or if other fluorine-containing gases are substituted for $CF_4$.

Thus, the radical plasma etch process of the invention provides a single step etch process or the removal of both the photoresist mask over a patterned polycide layer as well as the etch residues remaining on the sidewalls of the polycide after the step of patterning the polycide, using radicals generated in an upstream plasma generator from an etchant gas mixture consisting essentially of oxygen or water vapor or a mixture of same; and one or more fluorine-containing gases.

Having thus described the invention what is claimed is:

1. A plasma etch process for simultaneously removing photoresist and etch residues remaining from a prior polysilicon and/or polycide etch which comprises:
   (a) generating radicals in a plasma generator upstream of an etch chamber, from an etch gas mixture comprising:
      (i) oxygen, water vapor, or a mixture of same; and
      (ii) one or more fluorine-containing etchant gases; and
   (b) then contacting a substrate containing said photoresist and etch residues from said previous etch with said generated radicals in said etch chamber; to thereby remove both said photoresist and said etch residues.

2. The process of claim 1 wherein the amount of said oxygen, water vapor, or mixture of same in said etch gas mixture ranges from about 0.1 vol. % to about 20 vol. % of said one or more fluorine-containing etch gases.

3. The process of claim 2 wherein said one or more fluorine-containing etch gases are selected from the group consisting of $C_xF_y$, where x is 1–4 and y is either 2x or 2x+2; $C_xH_zF_y$, where x is 1–4, y is either from 1 to 2x+1 or from 1 to 2x−1, and z is 2x+2−y when y ranges from 1 to 2x+1 or 2x−y when y ranges from 1 to 2x−1; $NF_3$; or $SF_6$; and mixtures of two or more of same.

4. The process of claim 3 wherein said one or more fluorine-containing etch gases are selected from the group consisting of $C_xF_y$, where x is 1–4 and y is either 2x or 2x+2; $C_xF_y$, where x is 1–4, y is either from 1 to 2x+1 or from 1 to 2x−1, and z is 2x+2−y when y ranges from 1 to 2x+1 or 2x−y when y ranges from 1 to 2x−1; and mixtures of same.

5. The process of claim 4 wherein said one or more fluorine-containing etch gases are selected from the group consisting of $CF_4$, $CH_3F$, $CH_2F_2$, $CHF_3$, and mixtures of two or more of same.

6. The process of claim 2 wherein said etch gas mixture consisting essentially of oxygen and said one or more fluorine-containing etchant gases.

7. The process of claim 2 wherein said etch gas mixture consisting essentially of water vapor and said one or more fluorine-containing etchant gases.

8. The process of claim 2 wherein the pressure in said etch chamber is maintained within a range of from about 100 milliTorr to about 10 Torr during said plasma etch process.

9. The process of claim 2 wherein the temperature of said substrate during said process is maintained within a range of from about 100° C. to about 400° C. during said plasma etch process.

10. A plasma etch process for simultaneously removing photoresist and etch residues remaining from a prior polysilicon and/or polycide etch which comprises:
    (a) loading into a vacuum etch chamber a substrate having one or more raised polysilicon and/or polycide portions with sidewall etch residues on said raised portions and a photoresist mask over said raised portions;
    (b) generating radicals in a plasma generator upstream of said etch chamber, by:
       (i) flowing into said plasma generator an etch gas mixture comprising:
          (1) oxygen, water vapor, or a mixture of same; and
          (2) one or more fluorine-containing etchant gases; and
       (ii) igniting a plasma in said plasma generator during said flow of etch gas mixture therein; and
    (c) contacting said substrate in said etch chamber with said generated radicals to thereby remove both said photoresist and said etch residues in a single step.

11. The process of claim 10 wherein the amount of said oxygen, water vapor, or mixture of same in said etch gas mixture ranges from about 0.1 vol. % to about 10 vol. % of said one or more fluorine-containing etch gases.

12. The process of claim 10 wherein said one or more fluorine-containing etch gases are selected from the group consisting of $C_xF_y$, where x is 1–4 and y is either 2x or 2x+2; $C_xH_zF_y$, where x is 1–4, y is either from 1 to 2x+1 or from 1 to 2x−1, and z is 2x+2−y when y ranges from 1 to 2x+1 or 2x−y when y ranges from 1 to 2x−1; $NF_3$; or $SF_6$; and mixtures of two or more of same.

13. The process of claim 12 wherein said etch gas mixture consists essentially of oxygen and $CF_4$.

14. The process of claim 12 wherein said etch gas mixture consists essentially of water vapor and $CF_4$.

15. A plasma etch process for simultaneously removing photoresist and etch residues remaining from a prior polysilicon and/or polycide etch which comprises:
    (a) loading into a vacuum etch chamber, maintained at a pressure within a range of from about 100 milliTorr to about 10 Torr, a substrate having one or more raised polysilicon and/or polycide portions with sidewall etch residues on said raised portions and a photoresist mask over said raised portions;
    (b) maintaining said substrate in said etch chamber at a temperature within a range of from about 100° C. to about 400° C.;
    (c) generating radicals in a plasma generator upstream of said etch chamber, by:
       (i) flowing into said plasma generator an etch gas mixture comprising:
          (1) one or more fluorine-containing etchant gases selected from the group consisting of $C_xF_y$, where x is 1–4 and y is either 2x or 2x+2; $C_xH_zF_y$, where x is 1–4, y is either from 1 to 2x+1 or from 1 to 2x−1, and z is 2x+2−y when y ranges from 1 to 2x+1 or 2x−y when y ranges from 1 to 2x−1; $NF_3$; or $SF_6$; and mixtures of two or more of same;
          (2) oxygen, water vapor, or a mixture of same, in an amount ranging from about 0.1 vol. % to about 10 vol. % of said one or more fluorine-containing etchant gases; and
       (ii) igniting a plasma in said plasma generator during said flow of etch gas mixture therein to generate radicals therein; and
    (d) contacting said substrate in said etch chamber with said generated radicals to thereby remove both said photoresist and said etch residues in a single step.

16. The process of claim 15 wherein said one or more fluorine-containing etch gases are selected from the group consisting of $CF_4$, $CH_3F$, $CH_2F_2$, $CHF_3$, and mixtures of two or more of same.

17. The process of claim 15 wherein said one or more fluorine-containing etch gases consist essentially of $CF_4$.

18. The process of claim 15 wherein said oxygen, water vapor, and mixture thereof in said etch gas mixture consists essentially of oxygen.

19. The process of claim 15 wherein said oxygen, water vapor, and mixture thereof in said etch gas mixture consists essentially of water vapor.

* * * * *